US009123709B2

(12) United States Patent
Tamura

(10) Patent No.: US 9,123,709 B2
(45) Date of Patent: Sep. 1, 2015

(54) SEMICONDUCTOR DEVICE AND METHOD OF MANUFACTURING THE SAME

(71) Applicant: KABUSHIKI KAISHA TOSHIBA, Tokyo (JP)

(72) Inventor: Koji Tamura, Himeji Hyogo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 14/475,438

(22) Filed: Sep. 2, 2014

(65) Prior Publication Data

US 2015/0221581 A1 Aug. 6, 2015

(30) Foreign Application Priority Data

Jan. 31, 2014 (JP) ................................ 2014-017326

(51) Int. Cl.
*H01L 21/00* (2006.01)
*H01L 23/495* (2006.01)
*H01L 23/31* (2006.01)
*H01L 23/00* (2006.01)
*H01L 21/56* (2006.01)

(52) U.S. Cl.
CPC .......... *H01L 23/49513* (2013.01); *H01L 21/56* (2013.01); *H01L 23/3142* (2013.01); *H01L 23/49531* (2013.01); *H01L 23/49537* (2013.01); *H01L 23/49541* (2013.01); *H01L 24/33* (2013.01); *H01L 24/83* (2013.01); *H01L 2224/3226* (2013.01); *H01L 2224/832* (2013.01); *H01L 2224/838* (2013.01)

(58) Field of Classification Search
CPC ................. H01L 23/49513; H01L 23/49531; H01L 23/49537; H01L 23/49541; H01L 23/3142; H01L 21/56; H01L 24/23; H01L 2224/3226; H01L 2224/838; H01L 2224/832
USPC ......... 257/676, 666, 677, 672–675, 784, 788; 438/123, 124, 106–109, 112–113, 127
See application file for complete search history.

(56) References Cited

U.S. PATENT DOCUMENTS

| 8,847,374 | B2 | 9/2014 | Ide et al. | |
| 2005/0224945 | A1* | 10/2005 | Saito et al. | 257/686 |
| 2010/0165582 | A1* | 7/2010 | Hornkamp | 361/740 |
| 2014/0168901 | A1 | 6/2014 | Ide et al. | |

FOREIGN PATENT DOCUMENTS

JP 3935381 6/2007

* cited by examiner

*Primary Examiner* — Hoa B Trinh
(74) *Attorney, Agent, or Firm* — Patterson & Sheridan, LLP

(57) ABSTRACT

According to one embodiment, a first frame includes a first thin plate section and a first thick plate section. A second frame includes a second thin plate section and a second thick plate section. A semiconductor chip includes a first electrode bonded to a first inner surface of the first thin plate section of the first frame, and a second electrode bonded to a second inner surface of the second thick plate section of the second frame. A resin layer seals the semiconductor chip, but leaves exposed the first outer surface of the first frame and the second outer surface of the second frame.

20 Claims, 4 Drawing Sheets

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2014-017326, filed Jan. 31, 2014, the entire contents of which are incorporated herein by reference.

FIELD

Embodiments described herein relate generally to a semiconductor device and a method of manufacturing the same.

BACKGROUND

In recent years, in a power semiconductor device, a structure, which uses a plate-shaped connector, such as copper, or a strap, is proposed as a connection structure between a chip and an external lead, instead of wire bonding the chip to the external lead, to achieve a lower resistance connection.

In addition, a structure is proposed, in which a portion of the connector installed on a chip is exposed, i.e., a surface thereof is not enclosed in the resin sealing the package, and heat is radiated from both a package bottom surface and a package upper surface. If the upper surface of the connector is to be exposed from (not covered by) the resin, there is a method of grinding away a portion of the resin after covering the upper surface of the connector with the resin in a resin molding process. However, it is preferable that such a grinding process be unnecessary in view of cost or the like.

DETAILED DESCRIPTION

Figure 1A:
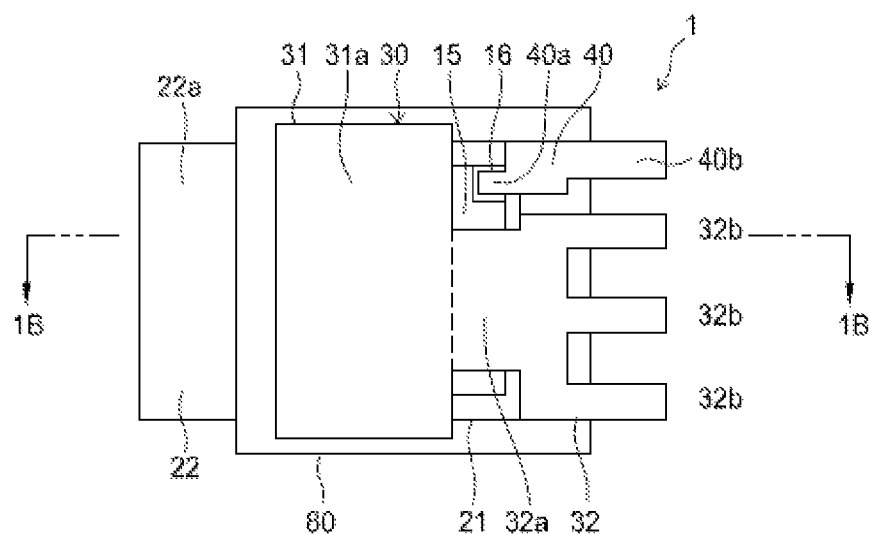
FIG. 1A is a schematic plan view illustrating a semiconductor device according to an embodiment.

Embodiments provide packaged semiconductor devices with highly repeatable accuracy of the thickness thereof thickness and a method of manufacturing the same.

In general, according to one embodiment, there is provided a semiconductor device including: a first frame, a second frame, a semiconductor chip, and resin. The first frame includes a first thin plate section including a first outer surface and a first inner surface opposite to the first outer surface, and a first thick plate section at an end thereof being thicker than the first thin plate section. The second frame includes a second thin plate section, and a second thick plate section at an end thereof including a second outer surface and a second inner surface opposite to the second outer surface, the second thick plate section thicker than the second thin plate section. The semiconductor chip is provided between the first thin plate section of the first frame and the second thick plate section of the second frame. The semiconductor chip includes a semiconductor layer including a first surface and a second surface opposite to the first surface, a first electrode provided on the first surface and bonded to the first inner surface of the first thin plate section of the first frame, and a second electrode provided on the second surface and bonded to the second inner surface of the second thick plate section of the second frame. A resin seals the semiconductor chip leaving exposed the first outer surface of the first frame and the second outer surface of the second frame.

Hereinafter, exemplary embodiments will be described with reference to the accompanying drawings. Meanwhile, the same reference numerals indicate the same components in each drawing.

FIG. 1A is a schematic top view illustrating a semiconductor device 1 according to an embodiment.

Figure 1B:
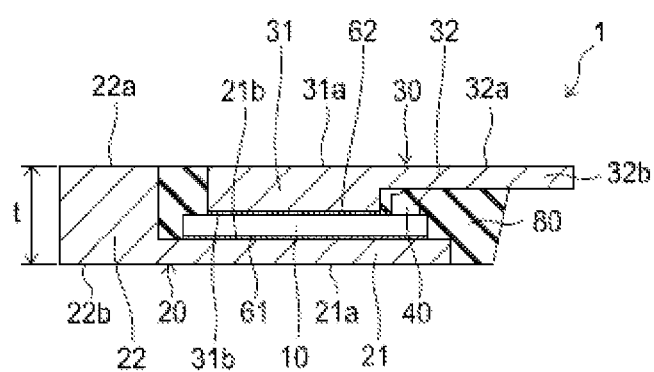
FIG. 1B is a schematic cross-sectional view of the semiconductor device of FIG. 1A at section 1B-1B.

FIG. 1B is a schematic cross-sectional view illustrating the semiconductor device 1 of FIG. 1A at section 1B-1B according to the embodiment.

The outline of the extent of resin layer 80 is shown in FIG. 1A.

The semiconductor device 1 according to the embodiment includes a semiconductor chip 10, frames 20 and 30 that are electrically connected to the semiconductor chip 10, and a resin layer 80 that seals surfaces of the semiconductor chip 10 exposed after the mounting thereof in the frame 20, 30.

The semiconductor chip 10 is a vertical type device in which a current path is formed in a vertical direction such that a first electrode which is provided on one surface side of a semiconductor layer is connected with a second electrode which is provided on the other surface side of the semiconductor chip 10. The semiconductor chip 10 is, for example, a vertical type Metal-Oxide-Semiconductor Field Effect Transistor (MOSFET). Alternatively, the semiconductor chip 10 is a vertical type Insulated Gate Bipolar Transistor (IGBT) or a vertical diode.

Silicon is used as a semiconductor of the semiconductor chip 10. Alternatively, a semiconductor other than the silicon (for example, a compound semiconductor such as SiC or GaN) may be used.

Figure 2A:
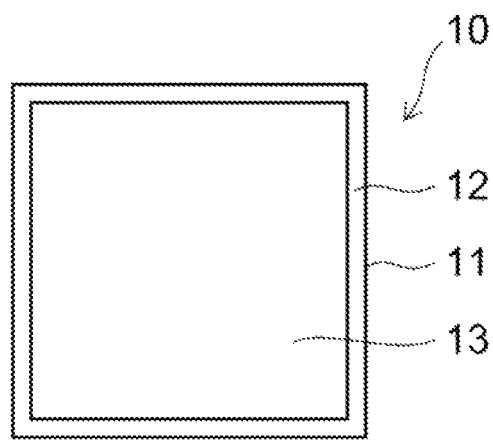
FIGS. 2A and 2B are schematic plan views illustrating a semiconductor chip according to the embodiment.
Figure 2B:
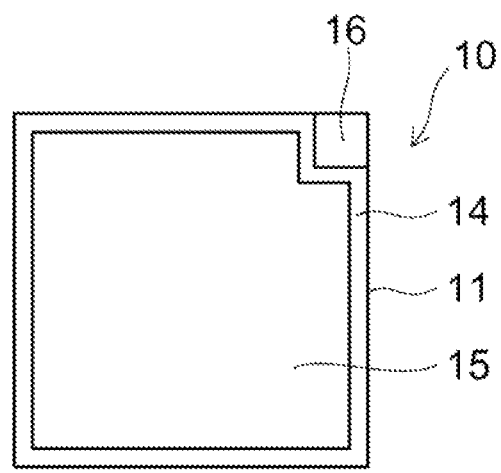

FIG. 2A is a schematic plan view illustrating the first surface 12 of the semiconductor chip 10, and FIG. 2B is a schematic plan view illustrating a second surface 14 on the opposite side of the semiconductor chip 10 from first surface 12.

As shown in FIG. 2A, a first electrode 13 is formed on the first surface 12 of a semiconductor layer 11. For example, a first electrode 13 is a drain electrode in the MOSFET. The first electrode 13 is formed to occupy most of the first surface 12.

As shown in FIG. 2B, a second electrode 15 and a third electrode 16 are formed on the second surface 14 of the semiconductor layer 11 so as to be insulated and isolated from each other. The second electrode 15 is formed to occupy most of the second surface 14, and is, for example, a source electrode in the MOSFET. The third electrode 16 has a smaller area than the second electrode 15, and is, for example, a gate electrode in the MOSFET.

The semiconductor chip 10 is provided between the first frame 20 and the second frame 30 as shown in FIG. 1B.

The first frame 20 includes a first thin plate section 21 and a first thick plate section 22. The thickness of the first thin plate section 21 is relatively different from the thickness of the first thick plate section 22, and the first thick plate section 22 is thicker than the first thin plate section 21.

The first frame 20 is formed by processing a die of a metal plate, such as by stamping the three dimensional first frame 20 from a strip of metal, and the first thin plate section 21 and the first thick plate section 22 are thus integrally provided in an L shape. The first frame 20 is formed of, for example, copper which is excellent in electrical conduction and thermal conduction. Meanwhile, copper alloy, which uses copper as a main component, or another metal may be used as the first frame 20.

The first thin plate section 21 includes a first outer surface 21a and a first inner surface 21b on the opposite side of the thin plate section 21 from the first outer surface 21a. The first thick plate section 22 protrudes outwardly from the side of the first inner surface 21b at one end of the first thin plate section 21. The surface 22b of the first thick plate section 22 extends as a flat continuation of the first outer surface 21a of the first thin plate section 21.

The semiconductor chip 10 is installed on the first inner surface 21b of the first thin plate section 21 of the first frame 20. The semiconductor chip 10 includes the first surface 12, on which the first electrode 13 is formed and which faces the first inner surface 21b of the first thin plate section 21.

The first electrode 13 of the semiconductor chip 10 is bonded to the first inner surface 21b of the first thin plate section 21 through a conductive bonding material (for example, solder) 61. Therefore, the first electrode 13 of the semiconductor chip 10 is electrically connected to the first frame 20.

The second frame 30 includes a second thick plate section 31 and a second thin plate section 32. The thickness of the second thick plate section 31 is different from the second thin plate section 32, and the second thick plate section 31 is thicker than the second thin plate section 32.

The second frame 30 is formed by processing a die of a metal plate, such as by stamping the three dimensional second frame 30 from a strip of metal, and the second thick plate section 31 and the second thin plate section 32 are thus integrally provided. The second frame 30 is formed of, for example, copper which is excellent in electrical conduction and thermal conduction. Meanwhile, copper alloy, which uses copper as a main component, or the other metal may be used as the second frame 30.

The second thick plate section 31 includes a second outer surface 31a and a second inner surface 31b on the opposite side from the second outer surface 31a. The first thick plate section 22 of the first frame 20 is located on one end side of the second thick plate section 31 while being separated from the second thick plate section 31. The second thin plate section 32 protrudes from the other end of the second plate 30 in a direction opposite to the position where the first thick plate section 22 of the first frame 20 is provided.

A step is formed between the second inner surface 31b of the second thick plate section 31 and the second thin plate section 32. A step is not formed between the second outer surface 31a of the second thick plate section 31 and a surface 32a of the second thin plate section 32 on the opposite side of the semiconductor chip 10, and the second outer surface 31a of the second thick plate section 31 and the surface 32a of the second thin plate section 32 extend together in a flat plane.

The second thick plate section 31 of the second frame 30 is installed on the second surface 14 of the semiconductor chip 10. The second thick plate section 31 of the second frame 30 includes a second inner surface 31b which faces the side of the second surface 14 of the semiconductor chip 10.

The second electrode 15 which is formed on the second surface 14 of the semiconductor chip 10 is bonded to the second inner surface 31b of the second thick plate section 31 of the second frame 30 through a conductive bonding material (for example, solder) 62. Therefore, the second electrode 15 of the semiconductor chip 10 is electrically connected to the second frame 30.

In addition, a gate connector lead 40 likewise formed as a stamped, and thus three-dimensionally formed, thin plate is provided on the side of the second surface 14 of the semiconductor chip 10 while being separated from, i.e., electrically isolated from, the second frame 30 as shown in FIG. 1A.

One end section 40a of the gate connector lead 40 is connected to the third electrode (gate electrode) 16 that is formed on the second surface 14 of the semiconductor chip 10 through, for example, a conductive bonding material such as solder. Alternatively, third electrode 16 may be connected to a separate lead frame for a gate, which is additionally provided, through wire bonding connection.

The semiconductor chip 10 is resin-sealed and thus protected from the external environment. The resin layer 80 (only the outline of the perimeter thereof is shown in FIG. 1 extending around the perimeter of the semiconductor chip 10) covers the perimeter surfaces of the semiconductor chip 10 and the first electrode 13 of the semiconductor chip 10, portions of the second side 21b of the first thin plate section 21 of the first frame 20 not covered by and bonded to the semiconductor chip 10 as well as the chip facing surface of the first thick plate section 22a, the sidewalls of the second thick plate section 31a of the second frame 30 and portions the second electrode 15 of the semiconductor chip 10 not covered by second plate 31, and portion of the gate connector lead 40 and the third electrode 16 not covered by the gate connector lead.

Thus, the space between the inner wall of the first thick plate section 22 of the first frame 20 and the side surface of the second thick plate section 31 of the second frame 30 is filled with the resin 80. Further, the space between the second thin plate section 32 of the second frame 30 and the first thin plate section 21 of the first frame 20 is filled with the resin 80. In addition, an end of the first thin plate section 21 of the first frame 20, which is on the opposite side of the first thick plate section 22, is also covered with the resin 80.

The first outer surface 21a of the first thin plate section 21 of the first frame 20, the both surfaces of the first thick plate section 22 of the first frame 20 in the thickness direction (height direction), the external side surface of the first thick plate section 22, the second outer surface 31a of the second thick plate section 31 of the second frame 30, and the surface 32a of the second thin plate section 32 of the second frame 30, which is on the opposite side of the semiconductor chip 10, are not covered with the resin layer 80 and are thus left exposed.

In addition, a plurality of leads 32b are integrally provided, and extend from the second thin plate section 32 of the second frame 30 on the side thereof opposed to second thick plate section 31, and the upper surfaces of the leads 32b as seen in the plan view of FIG. 1A protrude from, i.e. are not covered by, the resin layer 80. In addition, the other end section (lead) 40b of the gate connector 40 protrudes from the resin layer 80.

Figure 3A:
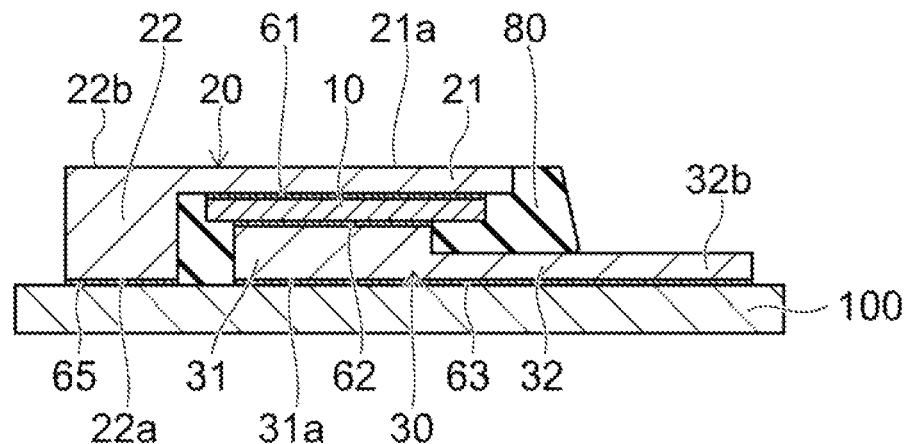
FIG. 3A is a schematic cross-sectional view illustrating the semiconductor device according to the embodiment.

As shown in FIG. 3A where the features are inverted as compared to FIG. 1, the surfaces of the second outer surface 31a of the second thick plate section 31 of the second frame 30 and the leads 32b that are exposed, i.e. uncovered by, the resin layer 80 are bonded to a conductor pattern (pattern for a source) of a mounting substrate (wiring substrate) 100 by, for example, a bonding material 63 such as solder. Likewise, the surface 22a of the first thick plate section 22 of the first frame 20 is bonded to a conductor pattern (pattern for a drain) of the mounting substrate 100 by, for example, a bonding material 65 such as solder.

In addition, the surface 22a of the first thick plate section 22 of the first frame 20 is bonded to a conductor pattern (pattern for a drain) of the mounting substrate 100 through, for example, a bonding material 65 such as solder.

Figure 3B:
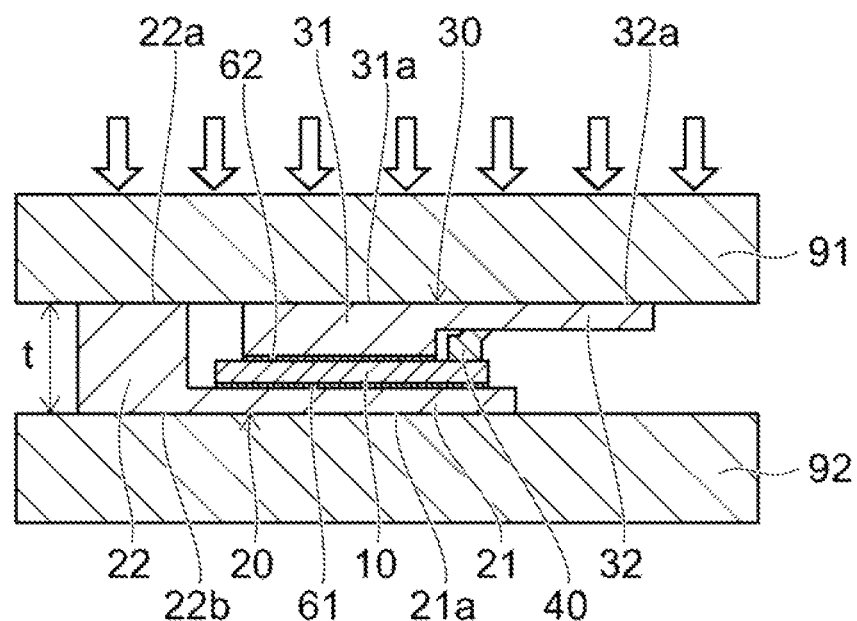
FIG. 3B is a schematic cross-sectional view illustrating a method of manufacturing the semiconductor device according to the embodiment.

In addition, the gate portion of the connector lead 40 shown in FIG. 3B contacting the third (gate) electrode 16 on second surface 14 is formed, for example, in a dog-leg shape, and the extending surface 40b of the gate connector lead 40 which protrudes through the resin 80 layer (not shown in FIG. 3B) is bonded to the conductor pattern (pattern for the gate) of the mounting substrate 100 by, for example, a bonding material such as solder.

The first outer surface 21a of the first thin plate section 21 of the first frame 20, which is exposed, i.e. not covered by, resin layer 80 on a side opposite to a mounting surface, and the surface 22b of the first thick plate section 22, which is connected to the first outer surface 21a, function as heat radiation surfaces. It is also possible to bond a heat sink, or an active cooling device to these heat radiation surfaces if necessary.

As is shown in FIGS. 1A and 3A, the depth of the recess formed in the first thin plate section 21, which is bounded by the first inner surface 21b and the side surface of the first thick plate section 22 extending therefrom, is equal to, or substantially equal to, the combined thicknesses of the second thick plate section 31a, the semiconductor chip 10, and the solder layers, 61 and 62. As a result, the upper surfaces of the first and second plates 20, 30 will be co-planar, or substantially co-planar, in the completed device, and thus these surfaces will both be easily bonded to the mounting substrate without bending or twisting to accommodate planar misalignment of the surface of the semiconductor device being bonded to the mounting substrate. Additionally, as will be described further herein, the thickness of the first thick plate section 22 can serve as a physical stop to set the overall thickness of the packaged semiconductor device.

Heat which is generated in the semiconductor chip 10 is conducted to the mounting substrate 100 through the second frame 30 and is removed to the outside of the semiconductor device 1 (for example, convected into the air) through, or radiated from, the first outer surface 21a of the first frame 20 that includes an area which is wider than that of the first electrode 13 (see FIG. 1A).

That is, the semiconductor device 1 according to the embodiment includes a double-sided heat transfer package structure, where heat may be removed therefrom through both the mounting substrate and exposed first outer surface 21a, and thus enables heat dissipation properties to be increased particularly in a case for high power use in which the heat calorie output value of the chip tends to be large.

The first frame 20 thus not only performs a function of electrically connecting the first electrode 13 of the semiconductor chip 10 to an external circuit but also performs a function as a radiator that radiates heat in a direction opposite to the mounting surface.

In addition, as will be described later with reference to FIG. 4B, it is possible to use the second frame 30 as the radiator that radiates heat in the direction opposite to the mounting surface.

If the second thin plate section 32 is thinner than the second thick plate section 31, it is possible to cause the resin 80 to intrude into a step section (recess) between the second thick plate section 31 and the second thin plate section 32, and thus it is possible to improve the peel strength of the resin 80.

The first outer surface 21a of the first frame 20 and the second outer surface 31a of the second frame 30 are flat surfaces that are parallel with each other. The thickness of the finished semiconductor device 1 is defined based on the thickness (height) t of the first thick plate section 22 of the first frame 20.

The thickness (height) t of the first thick plate section 22 of the first frame 20 is thicker than the thickness of the first thin plate section 21 of the first frame 20, the thickness of the semiconductor chip 10, and the thickness of the second thick plate section 31 of the second frame 30.

In addition, the thickness (height) t of the first thick plate section 22 of the first frame 20 is approximately the same as a total thickness (height) of the first thin plate section 21 of the first frame 20, the semiconductor chip 10, and the second thick plate section 31 of the second frame 30 and the bonding materials 61 and 62.

The above-described bonding material is not limited to solder. For example, a conductive paste, such as a silver paste, may be used. In any case, the bonding material is solidified from a state in which the bonding material is melted due to heat or from a state in which the bonding material has fluidity, and electrically connects two target elements to each other while fixing the two target elements.

If the first frame 20, the semiconductor chip 10, and the second frame 30 are only connected by the bonding materials 61 and 62, variations may occur in the thickness (height) of the semiconductor device 1 due to the tolerance of a member or variations in the thickness of solder that is the bonding material. In order to eliminate the variations, it is effective to place a laminated body of the first frame 20, the semiconductor chip 10, and the second frame 30 into dies, jigs, or the like from the frame side and to apply pressure.

That is, according to the embodiment, as shown in FIG. 3B, first, the bonding material (for example, solder) 61 is supplied on the first thin plate section 21 of the first frame 20, the semiconductor chip 10 is installed on the bonding material 61, the bonding material (for example, solder) 62 is supplied on the semiconductor chip 10, and the second thick plate section 31 of the second frame 30 is installed on the bonding material 62. For example, the bonding materials 61 and 62 are supplied by a method of coating using a dispenser.

Further, the laminated body of the first frame 20, the semiconductor chip 10, and the second frame 30 is inserted into a pair of dies (or jigs) 91 and 92 from a lamination direction. The first frame 20 is installed on the flat surface of one die (for example, a lower die) 92, and the flat surface of another die (for example, an upper die) 91 is pressed against the second outer surface 31a of the second frame 30 and the surface 22a of the first thick plate section 22 of the first frame 20.

In a state before the bonding materials 61 and 62 are reflowed (melted), the thickness of the laminated body is the same as the thickness t of the first thick plate section 22 of the first frame 20 or is slightly larger than the thickness t.

Further, in a state in which pressure is applied to the laminated body by the dies 91 and 92 in the lamination direction, the bonding materials 61 and 62 are heated and melted in a ref low oven.

The first thick plate section 22 of the first frame 20 functions as a physical stop for the relative pressing position of the die 91, 92, and thus it is possible to prevent excess pressure from being applied to the laminated body and simultaneously set the height of the finished semiconductor device. Therefore, it is possible to prevent damage (cracks or the like) for the semiconductor chip 10.

The melt bonding materials 61 and 62 receive the applied pressure in the lamination direction, the tolerance of a member or the variations in thickness of the bonding materials when supplied are absorbed by the compliance of the fluid state of the bonding materials, and thus the thickness (height)

of the semiconductor device is defined based on the thickness (height) t of the first thick plate section 22 of the first frame 20.

The bonding materials 61 and 62 that are melted in the reflow process are thereafter solidified, and the semiconductor chip 10 is thus bonded to the first frame 20 and the second frame 30.

Thereafter, the resin layer 80 is molded using a resin mold die. The resin layer 80 leaves exposed the first outer surface 21a of the first frame 20 and the second outer surface 31a of the second frame 30, and simultaneously covers the exposed surfaces of and thus seal the semiconductor chip 10.

In comparison, a method of molding thick resin on the second outer surface 31a of the second frame 30 and adjusting the height of a package by adjusting the amount of grind when the upper surface of the resin is ground in order to expose the second outer surface 31a is considered. However, in a grinding process, the material costs of the grinding wheel and an Ultraviolet (UV) sheet to which a grinding target is attached are high, supplementary facilities, such as a UV sheet attaching machine, an upper surface grinding machine, an UV irradiator, and an UV sheet peeling machine, are necessary, and thus the process becomes long and productivity is low and lead time is long.

According to the embodiment, even though a grinding process is not used to set the final thickness of the semiconductor device 1, it is possible to eliminate variations in the thickness (height) of the semiconductor device 1 using the pressing process shown in FIG. 3B in conjunction with the configuration of the first frame 20. Additionally, it is possible to prevent the damage to the chip using the configuration of the first thick plate section 22 of the first frame 20 because pressing thereof is limited by the presence of the first thick plate section 22 as a stop layer. Therefore, it is possible to provide a lower-cost semiconductor device in which certain material costs, or facilities for grinding, are not required and in which productivity is excellent.

Figure 4A:
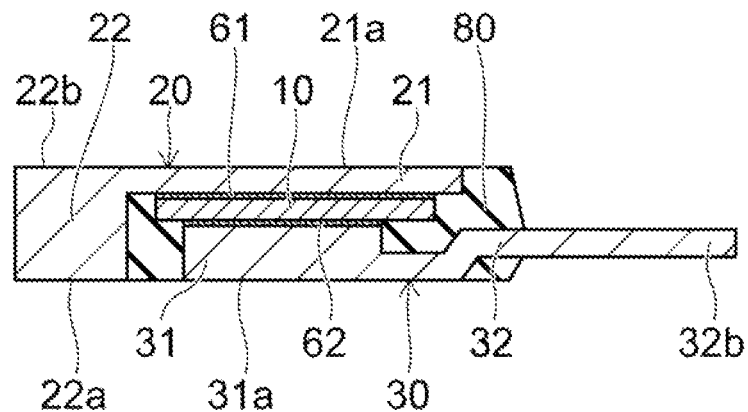
FIGS. 4A to 4C are schematic cross-sectional views illustrating the semiconductor device according to the embodiment.

The surface 32a of the second thin plate section 32 of the second frame 30 is not limited to a structure in which the surface 32a connected to the second outer surface 31a of the second thick plate section 31 is flat, and the second thin plate section 32 of the second frame 30 may be bent by forming a step between the surface 32a of the second thin plate section 32 and the leads 32b extending from the second thick plate section 31, which leads 32b protrude from the side surface of the resin layer 80 as shown in FIG. 4A.

Figure 4B:
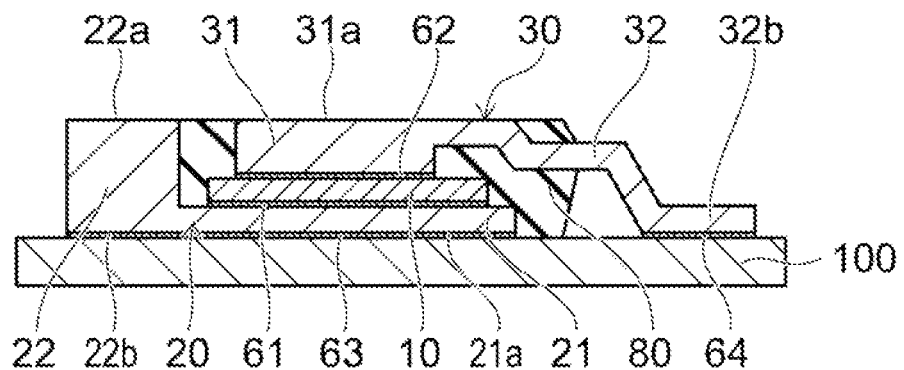
Figure 4C:
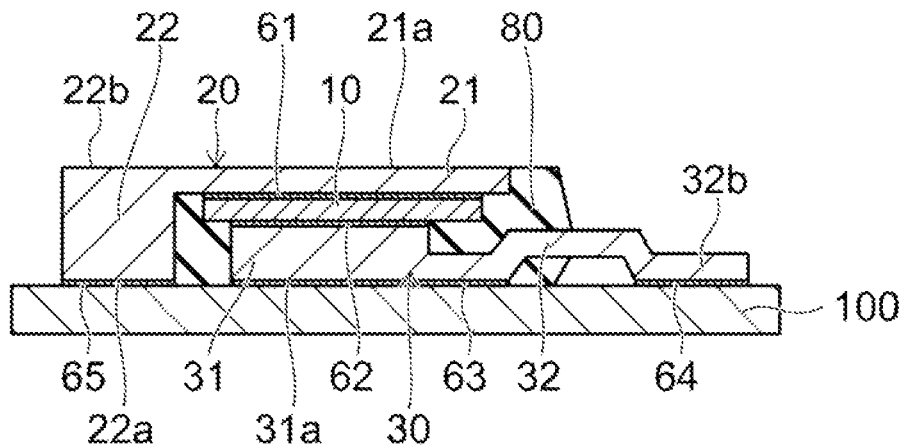

A so-called dog-leg is formed depending on whether the leads 32b of the second thin plate section 32 of the second frame 30, which protrude from the resin 80, are bent in the direction of the first outer surface 21a or bent in the direction of the second outer surface 31a, with the result that it is possible to respond to both a mounting form shown in FIG. 4B and a mounting form shown in FIG. 4C, and thus it is possible to flexibly respond to customer demands.

In FIG. 4B, the first outer surface 21a of the first frame 20 and the surface 22b of the first thick plate section 22 that is connected to the first outer surface 21a are bonded to the conductor pattern of the mounting substrate 100 through the bonding material (for example, solder) 63, and the bottom surfaces of the extending leads 32b of the second frame 30 are bonded to the conductor pattern of the mounting substrate 100 through the bonding material (for example, solder) 64.

In this configuration second outer surface 31a of the second frame 30 which is connected to the second electrode (source electrode) 15 is exposed, i.e. uncovered by the resin layer 80, as forming the package upper surface as a heat convection and radiation surface. In addition, heat which is propagated from the semiconductor chip 10 to the first frame 20 is conducted to the mounting substrate through the first thin plate section 21 and also conducted to the upper surface side and the side surface side of the package through the first thick plate section 22.

In FIG. 4C, the second outer surface 31a of the second frame 30 is bonded to the conductor pattern of the mounting substrate 100 through the bonding material 63, the surface 22a of the first thick plate section 22 of the first frame 20 is bonded to the conductor pattern of the mounting substrate 100 through the bonding material 65, and the bottom surface of the lead 32b of the second frame 30 is bonded to the conductor pattern of the mounting substrate 100 through the bonding material 64.

The first outer surface 21a of the first frame 20 that is connected to the first electrode (drain electrode) 13 functions as the heat convection and radiation surface and is exposed to the package upper surface.

In addition, heat that is propagated from the semiconductor chip 10 to the first frame 20 is conducted to the upper surface side of the package through the first thin plate section 21, and is conducted to the side surface side of the package and the side of the mounting substrate through the first thick plate section 22.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first frame including a first thin plate section that has a first outer surface and a first inner surface opposite to the first outer surface, and a first thick plate section thicker than the first thin plate section;
    a second frame including a second thin plate section and a second thick plate section that has a second outer surface and a second inner surface opposite to the second outer surface, the second thick plate section thicker than the second thin plate section;
    a semiconductor chip positioned between the first thin plate section of the first frame and the second thick plate section of the second frame and such that a first portion of the second thin plate section of the second plate faces a portion of the semiconductor chip, and a second portion of the second thin plate section extends from the first portion of the second thin plate section,
    the semiconductor chip having a first surface electrically connected to the first inner surface of the first thin plate section of the first frame, and a second surface opposite to the first surface electrically connected to the second inner surface of the second thick plate section of the second frame; and
    a resin layer contacting portions of the semiconductor chip and the first inner surface of the first plate and the first portion of the second thin plate section of the second plate.

2. The apparatus according to claim 1,
    wherein the thickness of the first thick plate section of the first frame is thicker than the sum of the thickness of the first thin plate section of the first frame, the thickness of the semiconductor chip, and the thickness of the second thick plate section of the second frame.

3. The apparatus according to claim 1, wherein the second portion of the second thin plate section extends outwardly of from the resin layer.

4. The apparatus of claim 1, wherein the first thick plate section of the first plate includes a first thick section outer surface extending from the first outer surface of the first thin plate section.

5. The apparatus according to claim 4, wherein the first thick section outer surface and the first outer surface of the first thin plate section form a connection surface to a wiring board.

6. The apparatus according to claim 1, wherein the resin layer extends between the first thick plate section and the second thick plate section;
and the second outer surface of the second thick plate and the surface of the resin layer extending between the first thick plate section and second thick plate section are coextensive with each other.

7. The apparatus according to claim 1, wherein the second portion of the second thin plate section provides a conductive lead for the semiconductor chip.

8. The apparatus according to claim 1, wherein the first thin plate section provides a conductive lead for the semiconductor chip.

9. The apparatus according to claim 1, further comprising a third lead extending from a contact position with the semiconductor chip, through the resin layer, and terminating outwardly of the resin layer.

10. A method of manufacturing a semiconductor device which includes a laminated body comprising:
a first frame having a first thin section including a first surface and a second surface opposed to the first surface, and a first thick section extending from the first surface of the of the first thin section at a side of the first surface of the first thin section;
a second frame having a second thick section and a second thin section extending from a side of the second thick section; and
a semiconductor chip,
wherein the method comprises:
positioning the semiconductor chip between the first thin section of the first frame and the second thick section of the second frame; and
forming a resin layer about the perimeter of the semiconductor chip,
wherein the total thickness of the first thin section, the second thick section and the semiconductor chip is less than or equal to the thickness of the first thick section of the first frame.

11. The method according to claim 10, further comprising the steps of:
providing a bonding material between the surfaces of the semiconductor chip and the first thin section and the second thin section;
heating and melting the bonding material and applying pressure through dies to press the first thin section and the second thin section toward each other; and
limiting the travel position of the dies with respect to each other with the first thick section.

12. The method according to claim 11, wherein the total thickness of the first thin section, the second thick section, the semiconductor chip and the bonding material is less than or equal to the thickness of the first thick section of the first frame.

13. The method according to claim 12,
wherein the total thickness of the first thin section, the second thick section, the semiconductor chip and the bonding material, prior to melting the bonding material, is greater than or equal to the thickness of the first thick section of the first frame.

14. The method according to claim 13, further comprising:
bonding the semiconductor chip to the first frame and the second frame by solidification after the bonding material has melted; and then
applying the resin layer to the semiconductor chip, while leaving the surface of the first frame opposite to the surface where the semiconductor chip is bonded thereto and the surface of the second frame opposite to the surface where the semiconductor chip is bonded thereto exposed.

15. The method according to claim 14, further comprising, prior to bonding the semiconductor chip to the first frame and the second frame by solidification after the bonding material has melted:
applying the resin layer to the semiconductor chip, while leaving the surface of the first frame opposite to the surface where the semiconductor chip is bonded thereto and the surface of the second frame opposite to the surface where the semiconductor chip is bonded thereto exposed;
contacting a first end of a third frame with the bonding material on one of the surfaces of the semiconductor chip; and
extending a second end of the third frame from the first end, such that, upon applying the resin layer to the semiconductor chip, the first end of the third frame is embedded in the resin layer and the second end of the third frame extends outwardly of the resin layer.

16. A packaged semiconductor device, comprising;
a first, electrically conductive, frame having a first thick portion having a thickness and a first thin portion extending therefrom, the first thick portion and the first thin portion forming a step section;
a semiconductor chip, having a first side, a second side, and a perimeter, positioned in the step section;
a second, electrically conductive, frame positioned on the semiconductor chip on a second side thereof disposed opposite to the first thin portion of the first frame, the second frame including a first portion thereof overlying the semiconductor chip and a second portion extending therefrom in a direction opposite of the location of the first thick portion relative to the first portion;
a third, electrically conductive, frame, extending from a contact location with the second side of the semiconductor chip at a position thereof spaced, and electrically isolated from, the second frame; and
a resin layer extending around the perimeter of the semiconductor chip and between the first thick portion of the first frame and the second frame adjacent the perimeter of the semiconductor chip and between the first thin portion of the first frame and the second frame adjacent the perimeter of the semiconductor chip.

17. The semiconductor device of claim 16, further comprising a conductive bonding material disposed between the first side of the semiconductor chip and the first thin portion of the first frame and the second side of the semiconductor chip and the second frame.

18. The semiconductor device of claim 17, wherein the combined thicknesses of the first thin portion, the semiconductor chip, the portion of the second frame overlying the semiconductor chip, and the bonding material, is less than or equal to the thickness of the first thick portion.

19. The semiconductor device of claim 18, wherein the first portion of the second frame is thicker than the second portion of the second frame.

20. The semiconductor device of claim 16, wherein the second portion of the second frame provides a lead for connecting the semiconductor device to an external device.

\* \* \* \* \*